(12) United States Patent
Mick

(10) Patent No.: US 6,577,520 B1
(45) Date of Patent: Jun. 10, 2003

(54) CONTENT ADDRESSABLE MEMORY WITH PROGRAMMABLE PRIORITY WEIGHTING AND LOW COST MATCH DETECTION

(75) Inventor: John R. Mick, Plano, TX (US)

(73) Assignee: Integrated Device Technology, Inc., Santa Clara ( * ) Notice: Subject to any disclaimer, the term of this patent is extended or adjusted under 35 U.S.C. 154(b) by 0 days.

(21) Appl. No.: 10/274,659

(22) Filed: Oct. 21, 2002

(51) Int. Cl.[7] ............................................. G11C 15/00
(52) U.S. Cl. ..................... 365/49; 365/189.07
(58) Field of Search .............. 365/49, 189.07

(56) References Cited

U.S. PATENT DOCUMENTS

| | | | |
|---|---|---|---|
| 4,928,260 A | 5/1990 | Chuang et al. | 365/49 |
| 4,996,666 A * | 2/1991 | Duluk, Jr. | 365/49 |
| 5,999,435 A * | 12/1999 | Henderson et al. | 365/49 |
| 6,278,289 B1 | 8/2001 | Gucchione et al. | 326/40 |
| 6,415,354 B1 | 7/2002 | Joffe et al. | 711/108 |

* cited by examiner

Primary Examiner—Richard Elms
Assistant Examiner—Tuan T. Nguyen
(74) Attorney, Agent, or Firm—Victor H. Okumoto, Esq.

(57) ABSTRACT

A content addressable memory with programmable priority weighting and low cost match detection is described. A CAM array provides match and no-match indications of an input data word to a weight array. The weight array generates a forced match with an assigned weight that is lower than those assigned to match and no-match indications received from the CAM array. The weight array determines a winning match among the received match indications and the forced match according to their assigned weights, and provides an indication of the winning match to an encoder. The encoder provides an address of the winning match, and a match detect output which is generated from the success or lack thereof of the forced match being determined the winning match.

12 Claims, 6 Drawing Sheets

CONTENT ADDRESSABLE MEMORY WITH PROGRAMMABLE PRIORITY WEIGHTING AND LOW COST MATCH DETECTION

FIELD OF THE INVENTION

The present invention generally relates to content addressable memory and in particular, to a content addressable memory with programmable priority weighting and low cost match detection.

BACKGROUND OF THE INVENTION

Content addressable memory (CAM) is useful in various applications such as address translation in network routers. FIG. 1 illustrates, as an example, a block diagram of a first prior art CAM arrangement including a CAM array 100 and a priority encoder 106. The CAM array 100 in this example has $2^N-1$ CAM cells, such as CAM cells 101~105. Each CAM cell includes a comparator and a register.

An input data word is provided to each CAM cell, and the CAM cell's comparator compares the input data word against the entry in its register. If they match, a match indication, such as a binary "1", is placed on the CAM cell's output line, such as output line M0 of CAM cell 101. On the other hand, if they do not match, a no-match indication, such as a binary "0", is placed on the output line.

The priority encoder 106 receives the match and no-match indications from the CAM array 100, and provides an N-bit binary output and a "match detect" output. If only one match indication is received, the N-bit binary output indicates an address location of the CAM cell register containing the matching entry. If multiple match indications are received, the priority encoder 106 first determines a winning match by selecting, for example, the match indication that is provided on a CAM cell output line corresponding to a highest physical position connection. The N-bit binary output then indicates the address location of a CAM cell register containing the winning matching entry.

The "match detect" output of the priority encoder 106 indicates whether or not the CAM array 100 has detected a match (i.e., whether at least one match indication has been received from the CAM array 100). If no match has been detected, then the N-bit binary output should be ignored. The "match detect" output may be generated at the output of OR logic by coupling all output lines M0~M2$^N$-1 (wherein the symbol "~" indicates the sequence of output lines from M0 to M2$^N$-1) of the CAM array 100 to inputs of the OR logic.

There are at least two perceived problems with the first prior art CAM arrangement. One problem is the fixed nature of its priority encoder 106 when determining a winning match among multiple match indications from the CAM array 100. In particular, it is advantageous in some applications to provide a capability to change the order of priority among the output lines of the CAM array 100. Otherwise, each time an entry is added or deleted from the CAM array 100, all of the entries would have to be rearranged again in proper priority order in the CAM array 100. Another problem is that generation of the "match detect" output may be circuit intensive when the number of match output lines is large. For example, a CAM array with 64K match output lines may require OR logic with 64K inputs to generate the "match detect" output.

FIG. 2 illustrates, as an example, a block diagram of a second prior art CAM arrangement including a CAM array 100, a weight array 200 and an encoder 206. This approach provides some level of flexibility in prioritizing match indications provided by the CAM array 100 on its output lines M0~M2$^N$-1. The CAM array 100 is identical in construction and operation as that described in reference to FIG. 1, therefore, it is given the same reference number and its description is not repeated here.

The weight array 200 determines a winner among match indications received from the CAM array 100 according to their respectively assigned weights, such as 201~205, that are stored in the weight array 200. The winner is indicated, for example, by a binary "1" placed on one of the output lines W0~W2$^N$-1 of the weight array 200, while non-winners are indicated by binary "0's" placed on all other of the output lines W0~W2$^N$-1.

The encoder 206 receives the winning and non-winning match information from the weight array 200, and provides an N-bit binary output and a "match detect" output. As in the first prior art CAM arrangement, the N-bit binary output indicates an address location of the CAM cell register containing the winning matching entry, and the "match detect" output indicates whether or not the CAM array 100 has detected a match. If no match has been detected, then the N-bit binary output should be ignored. The "match detect" output in this case may be generated at the output of OR logic by coupling all output lines W0~W2$^N$-1 of the weight array 200 to inputs of the OR logic (i.e., if no winner is detected, then it is assumed that no match indications were received from the CAM array 100).

Although it provides some capability to change the order of priority among the output lines M0~M2$^N$-1 of the CAM array 100, the second prior art CAM arrangement still generates the "match detect" output in much the same circuit intensive way as the first prior art CAM arrangement.

OBJECTS AND SUMMARY OF THE INVENTION

Accordingly, it is an object of the present invention to provide a content addressable memory with programmable priority weighting and low cost match detection.

Another object is to provide such a content addressable memory using minimal circuitry so as to minimize die size and therefore, cost of an integrated circuit device including such a content addressable memory.

These and additional objects are accomplished by the various aspects of the present invention, wherein briefly stated, one aspect is a content addressable memory comprising: a CAM array having a first plurality of addressable storage elements for storing a plurality of entries, comparison logic for comparing an input data word with individual of the plurality of entries, and a plurality of outputs providing match and no-match indications of the input data word with the plurality of entries; and a weight array coupled to the plurality of outputs of the CAM array for receiving the match and no-match indications, the weight array having a second plurality of addressable storage elements for storing weights respectively assigned to corresponding ones of the plurality of outputs of the CAM array and at least one storage element for storing a weight lower than the weights and assigned to a forced match indication, weight logic for determining a winner among the match indications and the forced match indication, and a plurality of outputs indicating the winner.

Another aspect is a method for determining whether a match has been detected by a content addressable memory, comprising: receiving match information from a content addressable memory for a plurality of lines assigned with weights; generating a forced match on a line assigned with a lowest weight; determining a winning match among the forced match and any matches indicated in the match information according to their respective weights; and determining whether a match has been detected by the content addressable memory from the success of the forced match being determined to be the winning match.

Another aspect is a weight array circuit employed to determine a winning match among indicated matches of a content addressable memory. A plurality of lines is individually coupled through a current limiting circuit to a high reference voltage at one end and open-ended at another end. A plurality of weight cells are organized in rows and columns, each column coupled to a corresponding one of the plurality of lines, and each row receiving a corresponding output of the content addressable memory to determine whether the corresponding output is a winning match. Individual of the plurality of weight cells include an addressable storage element for storing a weight value; a first NMOS transistor having a drain coupled to the corresponding one of the plurality of lines, and a gate coupled to the corresponding output of the content addressable memory if in a first column of the plurality of weight cells or an output of a prior weight cell in a same row if in any other column of the plurality of weight cells; a second NMOS transistor having a drain coupled to the first NMOS transistor source, a gate coupled to the output of the addressable storage element, and source coupled to a low reference voltage; a first NAND logic having a first input coupled to the first NMOS transistor gate, and second input coupled to the corresponding one of the plurality of lines; a second NAND logic having a first input coupled to the first NAND logic first input, and second input coupled to the output of the addressable storage element; and a third NAND logic having a first input coupled to the first NAND logic output, second input coupled to the second NAND logic output, and output providing an output indicating whether the corresponding output of the content addressable memory is a winning match if in a last column of the plurality of weight cells or an input to a next weight cell in the same row if in any other column of the plurality of weight cells.

Yet another aspect is a weight array circuit employed to determine a winning match among indicated matches of a content addressable memory. A plurality of lines is individually coupled through a current limiting circuit to a high reference voltage at one end and open-ended at another end. A plurality of weight cells are organized in rows and columns, each column is coupled to a corresponding one of the plurality of lines, and each row receives a corresponding output of a content addressable memory to determine whether the corresponding output is a winning match. Individual of the plurality of weight cells include: an addressable storage element for storing a weight value; a first NMOS transistor having a drain coupled to the corresponding one of the plurality of lines, and gate coupled to the corresponding output of the content addressable memory if in a first column of the plurality of weight cells or an output of a prior weight cell in a same row if in any other column of the plurality of weight cells; a first NAND logic having a first input coupled to the first NMOS transistor gate, and second input coupled to the corresponding one of the plurality of lines; first and second PMOS transistors, wherein the first and the second PMOS transistor sources are coupled to the high reference voltage, the first PMOS transistor gate is coupled to the first NMOS transistor gate, and the second PMOS transistor gate is coupled to the output of the addressable storage element; second and third NMOS transistors, wherein the second NMOS transistor drain is coupled to the first PMOS transistor drain and the second PMOS transistor drain, the second NMOS transistor gate is coupled to the first PMOS transistor gate, the third NMOS transistor drain is coupled to the first NMOS transistor source and the second NMOS transistor source, the third NMOS transistor gate is coupled to the output of the addressable storage element, and the third NMOS transistor source is coupled to a low reference voltage; and a third NAND logic having a first input coupled to the first NAND logic output, second input coupled to the drain of the second NMOS transistor, and output providing an output indicating whether the corresponding output of the content addressable memory is a winning match if in a last column of the plurality of weight cells or an input to a next weight cell in the same row if in any other column of the plurality of weight cells.

Additional objects, features and advantages of the various aspects of the present invention will become apparent from the following description of its preferred embodiment, which description should be taken in conjunction with the accompanying drawings.

DETAILED DESCRIPTION OF THE PREFERRED EMBODIMENT

Figure 1:
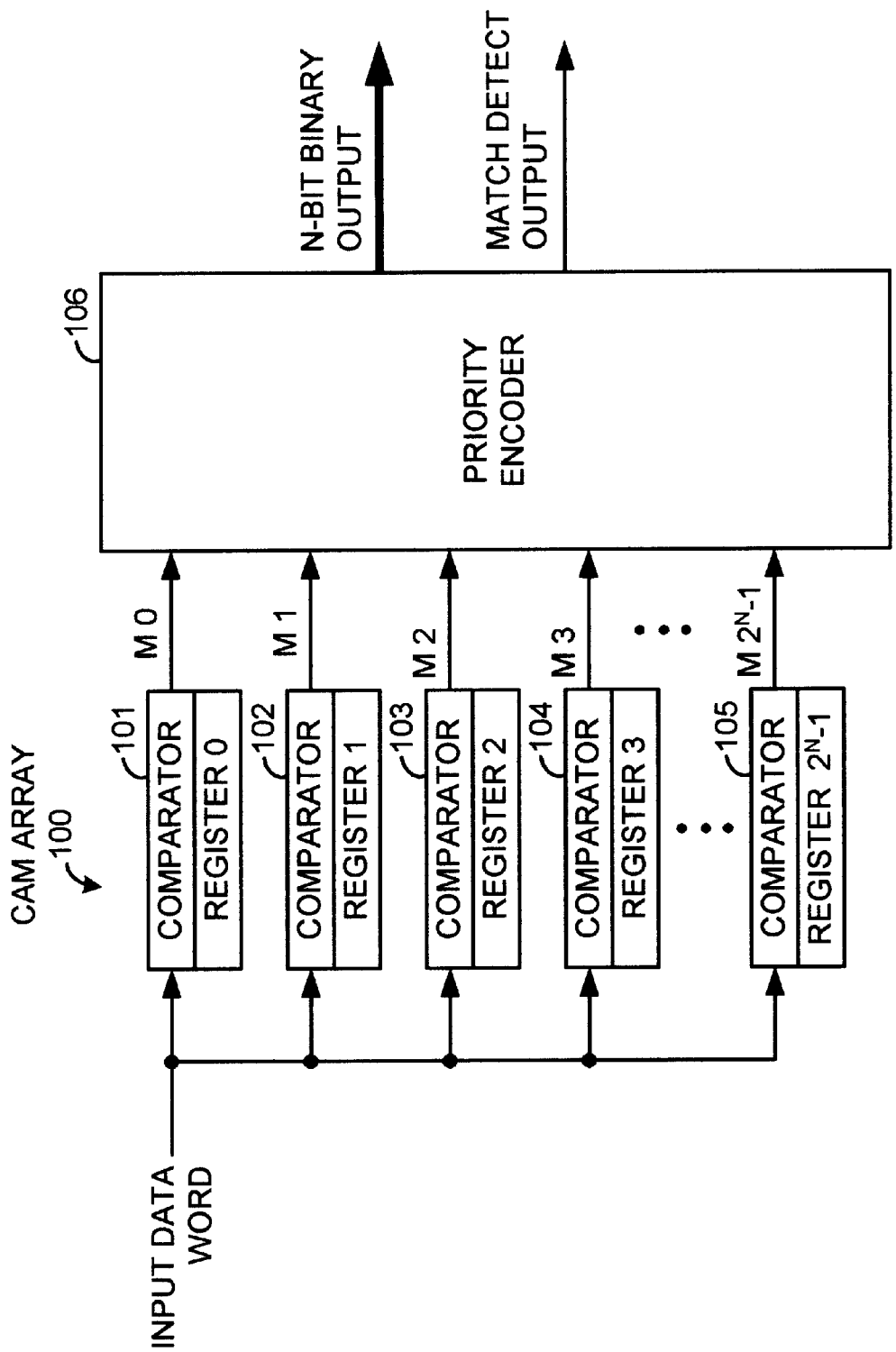
FIG. 1 illustrates, as an example, a block diagram of a prior art content addressable memory with fixed priority encoder.
Figure 3:
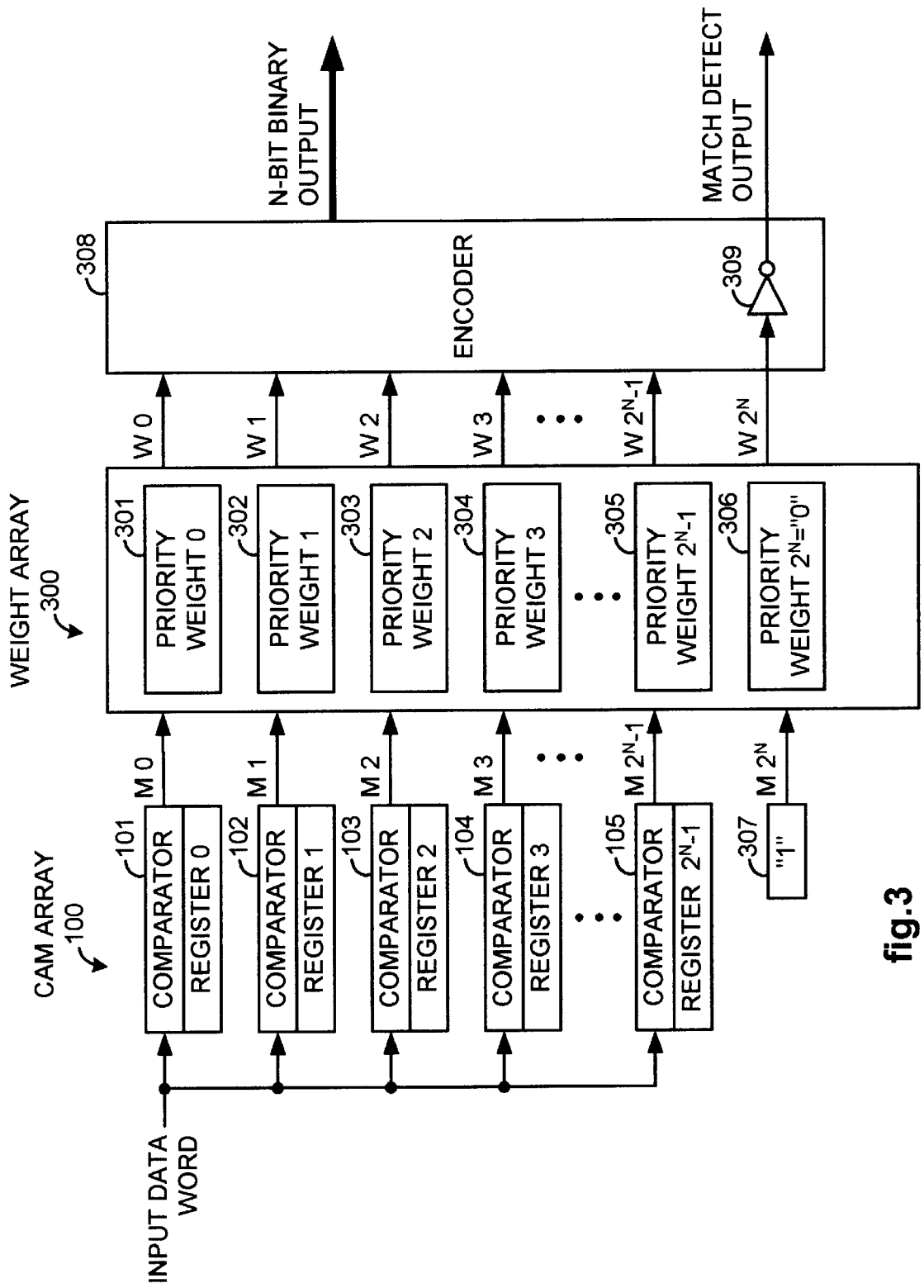
FIG. 3 illustrates, as an example, a block diagram of a content addressable memory with programmable priority weighting and low cost match detection, utilizing aspects of the present invention.

FIG. 3 illustrates, as an example, a block diagram of a content addressable memory with programmable priority weighting and low cost match detection. The content addressable memory (CAM) in this example includes a CAM array 100, weight array 300 and encoder 308. The CAM array 100 is identical in construction and operation as that described in reference to FIG. 1. Therefore, it and its components are given the same reference numbers, and a detailed description of the CAM array 100 is not repeated at this point.

Figure 2:
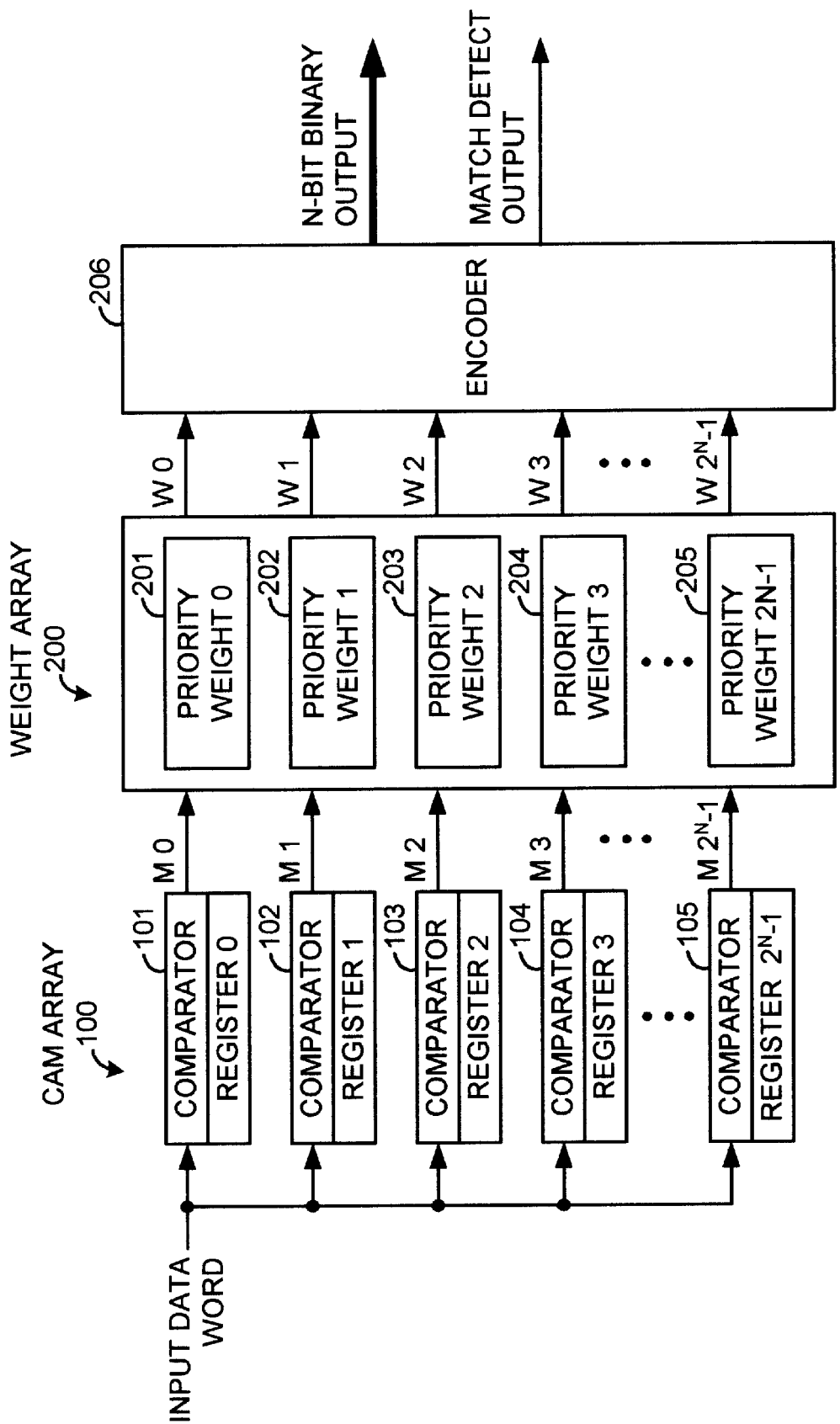
FIG. 2 illustrates, as an example, a block diagram of a prior art content addressable memory with priority weighting.

The weight array 300 is similar in function to that of the weight array 200 in FIG. 2, except that it has an added capability to force a match on an added or extra line in this case. In particular, whereas the outputs $M0$~$M2^N-1$ of the CAM array 100 indicate which of the CAM cells, such as CAM cells 101~105, detected a match with its register entry, their respectively corresponding outputs $W0$~$W2^N-1$ of the weight array 300 indicate which one, if any, of the match indications is a winning match.

Each of the output lines $W0$~$W2^N-1$ of the weight array 300 is assigned a priority weight (also simply referred herein as a "weight"), such as weights 301~304 for output lines W0~W3 and weights 305 and 306 for output lines $W2^N-1$ and $W2^N$. Thus, if only output lines M0 and M3 of the CAM array 100 provide match indications and their corresponding priority weights 301 and 304 are such that weight 301 is greater than weight 304, then output line W0 of the weight array 300 will indicate a winner while all other output lines $W1~W2^N$ of the weight array 300 indicate non-winners. The priority weight 306 for the forced match, as indicated by block 307, is selected to be a lowest weight of all other weights in the weight array 300, so that the output line $W2^N$ will only indicate a winner if there is no match indication provided on the output lines $M0~M2^N-1$ of the CAM array 100 (i.e., only no-match indications are provided on all output lines $M0~M2^N-1$ of the CAM array 100).

The encoder 308 receives the winning and non-winning match information from the weight array 300, and provides an N-bit binary output and a "match detect" output. As in prior art CAM arrangements, the N-bit binary output indicates an address location of the CAM cell register containing the winning matching entry, and the "match detect" output indicates whether or not the CAM array 100 has detected a match. If no match has been detected, then the N-bit binary output should be ignored.

Unlike the prior art CAM arrangements, however, the "match detect" output is simply generated by an inverter 309 having its input coupled to the output line $W2^N$ that corresponds to the forced match condition. As an example, if the CAM array 100 detects no matches for an input data word with its register entries, then the output line $W2^N$ of the weight array 300 is a binary "1" indicating a winner for the forced match, and the "match detect" output provided at the output of the inverter 309 is a binary "0". On the other hand, if the CAM array 100 detects at least one match for an input data word with its register entries, then the output line $W2^N$ of the weight array 300 is a binary "0" to indicate in this case a non-winner, because one of the higher weighted match indications has been determined the winner by the weight array 300, and the "match detect" output provided at the output of the inverter 309 is a binary "1". Thus, the state of the "match detect" output which indicates whether at least one match indication was received from the CAM array 100 by the weight array 300 is determined by whether or not the forced match indication is determined to be the winner by the weight array 300.

Figure 4:
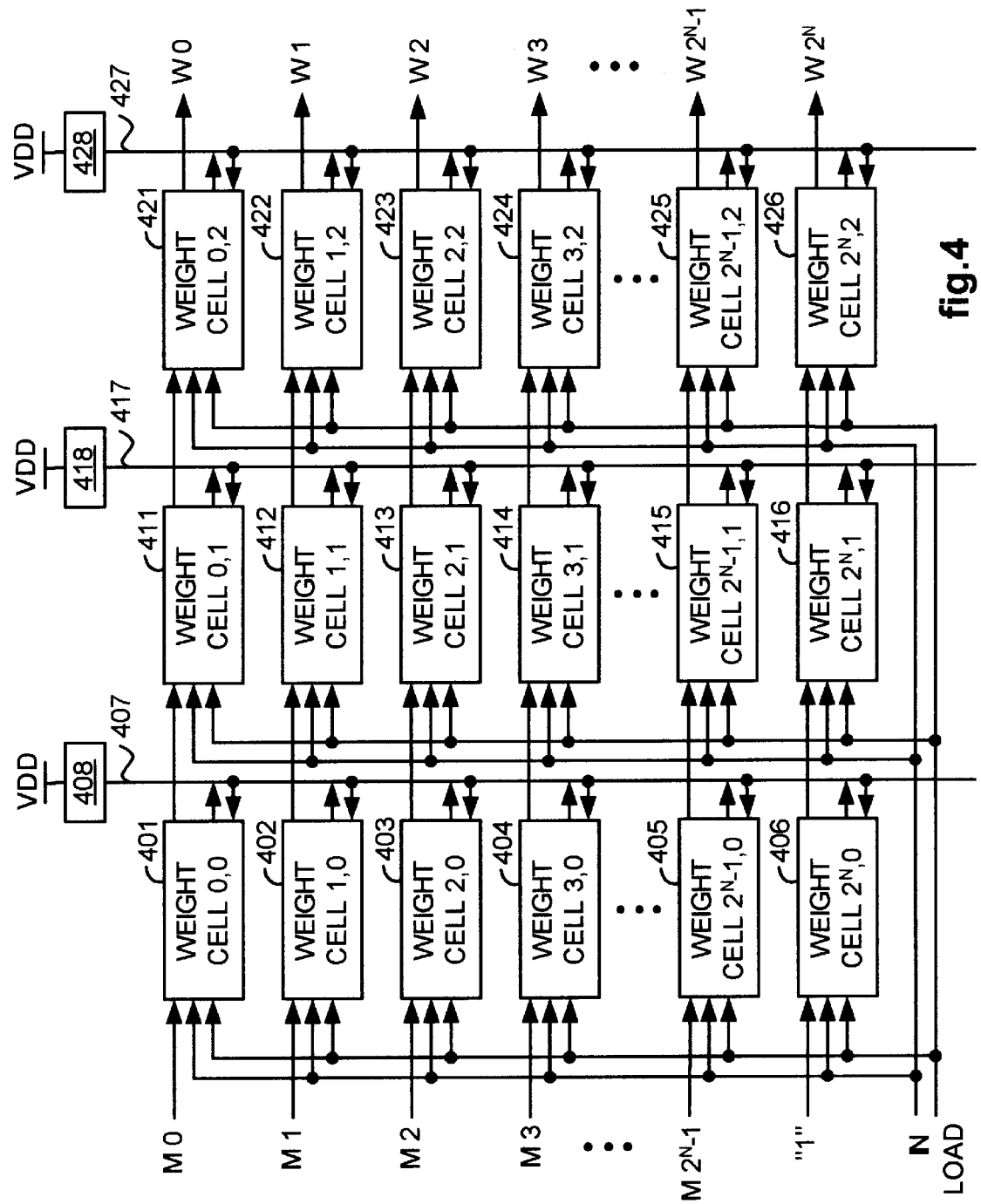
FIG. 4 illustrates, as an example, a block diagram of a programmable weight array, utilizing aspects of the present invention.

FIG. 4 illustrates, as an example, a block diagram of the programmable weight array 300. The weight array 300 is referred to as being "programmable", because the weights associated with a CAM entry can be written into their respective storage elements at the same time the CAM entry is updated.

The weight array 300 includes a plurality of weight cells organized in rows and columns. Each of the first $2^N-1$ rows of the weight array 300 includes weight cells that cumulatively provide the priority weight for a corresponding output of the CAM array 100. For example, a first row of the weight array 300 is shown in FIG. 4 to include weight cells 401, 411 and 421 that cumulatively provide the priority weight 301 for the output M0 of the CAM array 100 and its corresponding output W0 of the weight array 300. The $2^N$th row of the weight array 300, on the other hand, includes weight cells 406, 416 and 426 that cumulatively provide the priority weight 306 for the forced match, as indicated by a "1" input to the row.

The number of columns of weight cells indicates a maximum resolution for the weights. For example, in the present example where each weight cell contains one bit of its corresponding weight, the three weight cells in each row combine to provide a resolution of $2^3$ in binary. For higher resolution, more columns may be added. Preferably, the weight cell for the most significant bit of each priority weight is on the left coupled to its corresponding one of the output lines $M0~M2^N-1$ of the CAM array 100, and the weight cell for the least significant bit of each priority weight is on the right providing information of whether it is determined to be the winner or a non-winner on its corresponding one of the output lines $W0~W2^N-1$ of the weight array 300.

Each column of weight cells is coupled to an open-ended line that is dedicated to that column. For example, in the present example a first column including weight cells 401~406 provide inputs to the open-ended line 407, and the open-ended line 407 in turn, provides a common input to all of the weight cells in its column. The purpose of the open-ended line in each column is to make sure that a match indication entering a weight cell in the column is not prematurely turned into a non-winner, as will be further described in reference to the following descriptions of weight cells. Each of the open-ended lines 407, 417 and 427 is coupled through one of current limiting circuits 408, 418 and 428 to a high reference voltage VDD at one end, and is open-ended at the other end.

Figure 5:
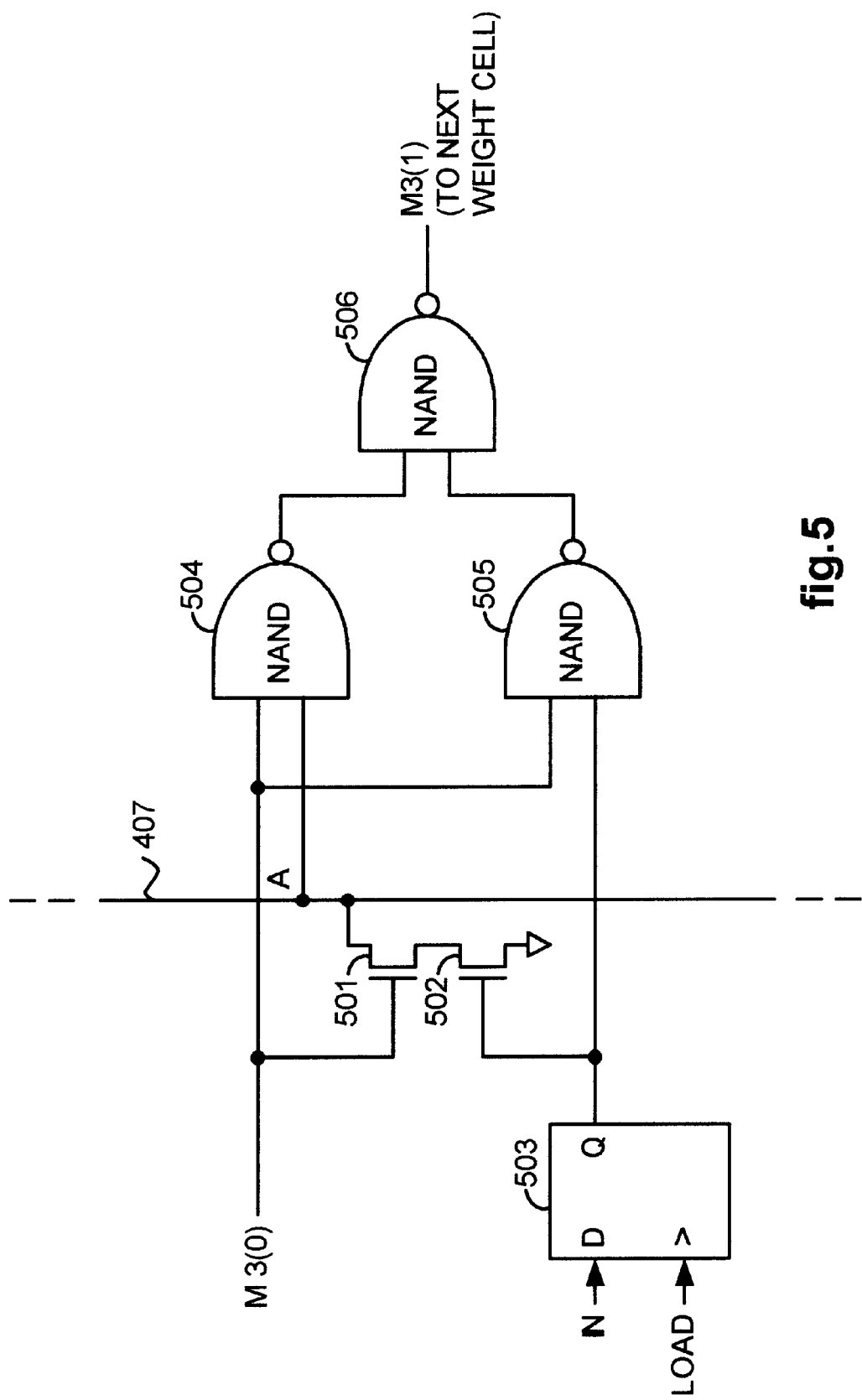
FIG. 5 illustrates, as an example, a logic diagram of a programmable weight cell, utilizing aspects of the present invention.

FIG. 5 illustrates, as a representative example of all weight cells in the weight array 300, a logic diagram of the programmable weight cell 404. The weight cell 404 includes first and second NMOS transistors 501 and 502, a D-Q latch 503, and first, second and third NAND logic 504, 505 and 506. Employment of NAND logic in the weight cell 404 is particularly advantageous over prior art implementations, because of the relatively smaller number of gate delays necessary to implement such logic. Inputs into the weight cell 404 include a match or no-match indication M3(0) received from output line M3 of the CAM array 100, a weight bit input (IN) provided along a data bus coupled to each of the latches in the weight array 300, a latch load command (LOAD), and an input A provided by the open-ended line 407. In addition to being provided as an input to the weight cell 404, the input A is also provided to all other weight cells in same column, both above the weight cell 404 (such as weight cells 401~403) and below it (such as weight cells 405 and 406). The output from the weight cell 404 is a match or no-match or no-win indication M3(1) that is provided as input for the next weight cell 414 in the same row as weight cell 404.

The latch 503 serves as a storage element for storing a most significant bit of the weight 304. Other bits of the weight 304 are stored in corresponding latches of weight cells 414 and 424. Alternatively, these latches could be replaced with a register, in which case, each bit of the weight 304 would be stored in a corresponding bit of the register. In either implementation, the weight 304 is written or programmed into the storage element(s) by providing the weight value on the data bus and activating the latch or register load command (LOAD).

The first and second NMOS transistors 501 and 502 are coupled to the open-ended line 407 such that if they are both turned ON, then they pull the open-ended line 407 and consequently, input A down to the low reference voltage. Likewise, if corresponding NMOS transistors in any other weight cell in the same column are both turned ON, then they too pull the open-ended line 407 and consequently, input A down to the low reference voltage. Only if at least one of the pair of NMOS transistors in each of the weight cells in the same column is turned OFF will the voltage on the open-ended line 407 remain at the high reference voltage VDD. Since the first and second NMOS transistors are turned ON respectively by the input M3(0) and the output (W-bit) of the D-Q latch 503, this results in the input A only going LOW (0) if the input to the weight cell and the output of the D-Q latch for any weight cell in the same column as weight cell 404 are both HIGH (1). This type of arrangement resembles what is commonly referred to as a "wired-OR" function.

Operation of the weight cell 404 is clarified through the following truth table.

| M3 (0) | W-bit | A | M3 (1) |
|--------|-------|---|--------|
| 1 | 1 | 0 | 1 |
| 0 | 0 | 1 | 0 |
| 0 | 0 | 0 | 0 |
| 0 | 1 | 1 | 0 |
| 0 | 1 | 0 | 0 |
| 1 | 0 | 0 | 0 |
| 1 | 0 | 1 | 1 |

Starting with the first case, the input M3(0) to the weight cell 404 is a "1" indicating that an input data word has been matched with the corresponding register entry by the CAM array 100 and the weight bit (W-bit) is a "1" indicating a highest weight bit level. In this case, the output of the weight cell M3(1) is also a "1", as would be expected. If there is one or more other weight cells in the same column also providing an output of "1", then the next column or stage of weight cells will try to break the tie to determine a winner.

In the next four cases, the input M3(0) to the weight cell 404 is a "0" indicating that an input data word has not been matched with the corresponding register entry by the CAM array 100 in any of these cases. Therefore, regardless of the value of the weight bit (W-bit) in these cases, the output of the weight cell M3(1) is a "0", as would be expected.

In the last two cases, the input M3(0) to the weight cell 404 is a "1" indicating that an input data word has been matched with the corresponding register entry by the CAM array 100, but the weight b it (W-bit) is a "0" indicating a lowest weight bit level. When the input A is a "0" indicating that another weight cell in the same column has received an input Mi(0) of "1" and has a weight bit of "1", then the output of the weight cell M3(1) is a "0" indicating that it is a non-winner. On the other hand, when the input A is a "1" indicating that no other weight cell in the same column has received an input Mi(0) of "1" and has a weight bit of "1", then the output of the weight cell M3(1) is a "1". If there are one or more other weight cells in the same column also providing an output of "1", then the next column or stage of weight cells will try to break the tie to determine a winner. On the other hand, if there is no other weight cell in the same column also providing an output of "1" for any reasons, then the match indication being processed by the weight cell 404 is the winner, and therefore, should not be marked as a non-winner at this stage.

Thus, the purpose of the open-ended line 407 (in combination with other logic of the weight cell 404) is to accommodate proper resolution of these last two cases. In particular, it makes sure that a match indication entering a weight cell in the column is not prematurely turned into a non-winner as described above.

Figure 6:
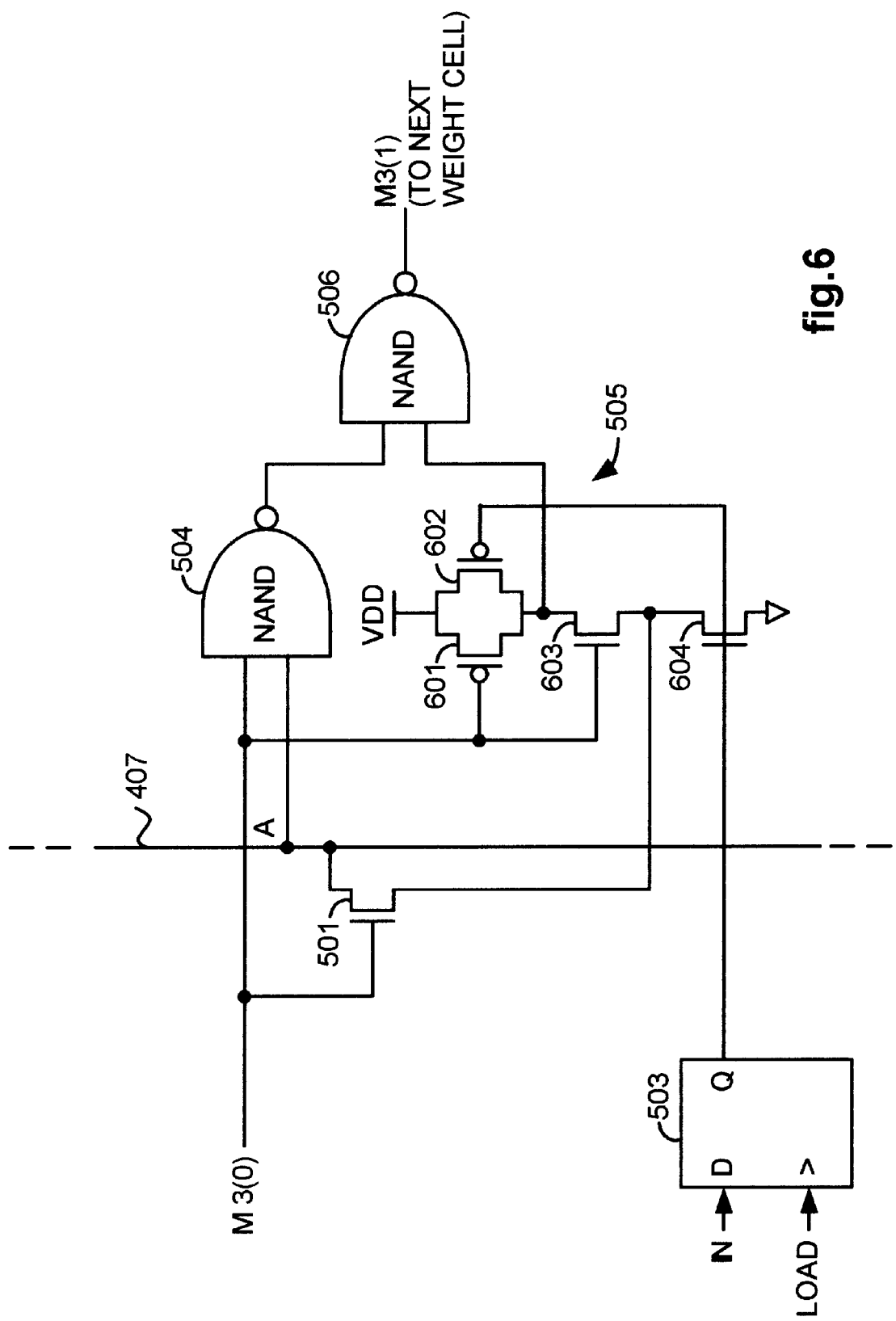
FIG. 6 illustrates, as an example, a hybrid logic/circuit diagram of another programmable weight cell, utilizing aspects of the present invention.

FIG. 6 illustrates, as another representative example of all weight cells in the w eight array 300, a hybrid logic and circuit diagram of a preferred embodiment of the programmable weight cell 404. In this example, the second NAND logic 505 is shown further detailed as a circuit including PMOS transistors 601 and 602, and NMOS transistors 603 and 604. This implementation of the weight cell 404 is similar to that described in reference to FIG. 5 with the exception that the second NMOS transistor 502 of FIG. 5 has been eliminated and the source of NMOS transistor 501 is coupled instead to the drain of NMOS transistor 604 of the second NAND logic 505. Thus, this implementation saves one NMOS transistor for each weight cell in the weight array 300, resulting in potential die area savings for an integrated circuit device including the weight array 300.

Although the various aspects of the present invention have been described with respect to a preferred embodiment, it will be understood that the invention is entitled to full protection within the full scope of the appended claims.

I claim:

1. A content addressable memory comprising:

a CAM array having a first plurality of addressable storage elements for storing a plurality of entries, comparison logic for comparing an input data word with individual of said plurality of entries, and a plurality of outputs providing match and no-match indications of said input data word with said plurality of entries; and a weight array coupled to said plurality of outputs of said CAM array for receiving said match and no-match indications, said weight array having a second plurality of addressable storage elements for storing weights respectively assigned to corresponding ones of said plurality of outputs of said CAM array and at least one storage element for storing a weight lower than said weights and assigned to a forced match indication, weight logic for determining a winner among said match indications and said forced match indication, and a plurality of outputs indicating said winner.

2. The content addressable memory according to claim 1, further comprising encoder logic providing a match detect output indicating whether at least one match indication was received from said CAM array by said weight array as determined by whether or not said forced match indication is determined to be said winner.

3. The content addressable memory according to claim 2, wherein it is determined that at least one match indication was received from said CAM array if said forced match indication is determined not to be said winner.

4. The content addressable memory according to claim 2, wherein it is determined that no match indication was received from said CAM array if said forced match indication is determined to be said winner.

5. The content addressable memory according to claim 2, wherein said encoder logic further provides an address corresponding to said winner.

6. The content addressable memory according to claim 1, wherein the number of said plurality of outputs of said CAM array equals one less than the number of said plurality of outputs of said weight array so as to accommodate an extra output for said forced match indication.

7. The content addressable memory according to claim 1, wherein the number of said plurality of outputs of said CAM array equals the number of said plurality of outputs of said weight array, wherein a match or no-match indication on one of said plurality of outputs of said CAM array is over-written by said forced match indication.

8. A method for determining whether a match has been detected by a content addressable memory, comprising:

receiving match information from a content addressable memory for a plurality of lines assigned with weights;

generating a forced match on a line assigned with a lowest weight;

determining a winning match among said forced match and any matches indicated in said match information according to their respective weights; and determining whether a match has been detected by said content addressable memory from the success of said forced match being determined to be said winning match.

9. The method according to claim 8, wherein said determining whether a match has been detected by said content addressable memory from the success of said forced match being determined to be said winning match, comprises determining that a match has been detected by said content addressable memory if said forced match is not determined to be said winning match.

10. The method according to claim 8, wherein said determining whether a match has been detected by said content addressable memory from the success of said forced match being determined to be said winning match, comprises determining that a match has not been detected by said content addressable memory if said forced match is determined to be said winning match.

11. A weight array circuit employed to determine a winning match among indicated matches of a content addressable memory, comprising:

a plurality of lines individually coupled to a current limited high reference voltage at one end and open-ended at another end; and a plurality of weight cells organized in rows and columns, each column coupled to a corresponding one of said plurality of lines, and each row receiving a corresponding output of a content addressable memory to determine whether said corresponding output is a winning match, wherein individual of said plurality of weight cells includes an addressable storage element for storing a weight value;

a first NMOS transistor having a gate, drain, and source, wherein said first NMOS transistor drain is coupled to said corresponding one of said plurality of lines, and said first NMOS transistor gate is coupled to said corresponding output of said content addressable memory if in a first column of said plurality of weight cells or an output of a prior weight cell in a same row if in any other column of said plurality of weight cells;

a second NMOS transistor having a gate, drain, and source, wherein said second NMOS transistor drain is coupled to said first NMOS transistor source, said second NMOS transistor gate is coupled to an output of said addressable storage element, and said second NMOS transistor source is coupled to a low reference voltage;

a first NAND logic having a first input, second input, and output, wherein said first NAND logic first input is coupled to said first NMOS transistor gate, and said first NAND gate second input is coupled to said corresponding one of said plurality of lines;

a second NAND logic having a first input, second input, and output, wherein said second NAND logic first input is coupled to said first NAND logic first input, and second NAND logic second input is coupled to said output of said addressable storage element; and a third NAND logic having a first input, second input, and output, wherein said third NAND logic first input is coupled to said first NAND logic output, said third NAND logic second input is coupled to said second NAND logic output, and said third NAND logic output provides an output indicating whether said corresponding output of said content addressable memory is a winning match if in a last column of said plurality of weight cells or an input to a next weight cell in the same row if in any other column of said plurality of weight cells.

12. A weight array circuit employed to determine a winning match among indicated matches of a content addressable memory, comprising:

a plurality of lines individually coupled to a current limited high reference voltage at one end and open-ended at another end; and a plurality of weight cells organized in rows and columns, each column coupled to a corresponding one of said plurality of lines, and each row receiving a corresponding output of a content addressable memory to determine whether said corresponding output is a winning match, wherein individual of said plurality of weight cells includes an addressable storage element for storing a weight value;

a first NMOS transistor having a gate, drain, and source, wherein said first NMOS transistor drain is coupled to said corresponding one of said plurality of lines, and said first NMOS transistor gate is coupled to said corresponding output of said content addressable memory if in a first column of said plurality of weight cells or an output of a prior weight cell in a same row if in any other column of said plurality of weight cells;

a first NAND logic having a first input, second input, and output, wherein said first NAND logic first input is coupled to said first NMOS transistor gate, and said first NAND gate second input is coupled to said corresponding one of said plurality of lines;

first and second PMOS transistors individually having a gate, source, and drain, wherein said first and said second PMOS transistor sources are coupled to said high reference voltage, said first PMOS transistor gate is coupled to said first NMOS transistor gate, and said second PMOS transistor gate is coupled to said output of said addressable storage element;

second and third NMOS transistors individually having a gate, drain, and source, wherein said second NMOS transistor drain is coupled to said first PMOS transistor drain and said second PMOS transistor drain, said second NMOS transistor gate is coupled to said first PMOS transistor gate, said third NMOS transistor drain is coupled to said first NMOS transistor source and said second NMOS transistor source, said third NMOS transistor gate is coupled to said output of said addressable storage element, and said third NMOS transistor source is coupled to a low reference voltage; and a third NAND logic having a first input, second input, and output, wherein said third NAND logic first input is coupled to said first NAND logic output, said third NAND logic second input is coupled to said drain of said second NMOS transistor, and said third NAND logic output provides an output indicating whether said corresponding output of said content addressable memory is a winning match if in a last column of said plurality of weight cells or an input to a next weight cell in the same row if in any other column of said plurality of weight cells.

* * * * *